US011689200B2

(12) United States Patent
Cretu et al.

(10) Patent No.: US 11,689,200 B2
(45) Date of Patent: Jun. 27, 2023

(54) SAMPLING SWITCH CIRCUITS

(71) Applicant: SOCIONEXT INC, Kanagawa (JP)

(72) Inventors: Vlad Cretu, Maidenhead (GB); Masahiro Kudo, Maidenhead (GB)

(73) Assignee: SOCIONEXT INC., Kanagawa (JP)

(*) Notice: Subject to any disclaimer, the term of this patent is extended or adjusted under 35 U.S.C. 154(b) by 0 days.

(21) Appl. No.: 17/834,653

(22) Filed: Jun. 7, 2022

(65) Prior Publication Data

US 2022/0407513 A1 Dec. 22, 2022

(30) Foreign Application Priority Data

Jun. 18, 2021 (EP) .................... 21180456

(51) Int. Cl.
*H03K 17/687* (2006.01)

(52) U.S. Cl.
CPC .............. *H03K 17/6872* (2013.01)

(58) Field of Classification Search
CPC ............................. H03K 17/6872
USPC ....................................... 327/581
See application file for complete search history.

(56) References Cited

U.S. PATENT DOCUMENTS

| 3,942,039 A | 3/1976 | Kikuchi |
| 6,525,574 B1* | 2/2003 | Herrera ............ G11C 27/024 327/94 |
| 2003/0042936 A1 | 3/2003 | Herrera |
| 2015/0188533 A1 | 7/2015 | Viswanath et al. |
| 2015/0200663 A1 | 7/2015 | Yang et al. |
| 2018/0138920 A1 | 5/2018 | Sharma et al. |

FOREIGN PATENT DOCUMENTS

EP     1821313 A1    8/2007

OTHER PUBLICATIONS

Extended European Search Report issued in European Patent Application No. 21180456.2, dated Dec. 2, 2021.

* cited by examiner

*Primary Examiner* — Tomi Skibinski
(74) *Attorney, Agent, or Firm* — McDermott Will & Emery LLP

(57) ABSTRACT

A sampling switch circuit, including an input node, which receives an input voltage signal to be sampled, a sampling transistor having gate, source and drain terminals, the source terminal connected to the input node, a capacitor, a current source configured to cause a defined current to flow therethrough and switching circuitry configured to alternate between a precharge configuration and an output configuration depending upon a clock signal. In the precharge configuration, the switching circuitry connects the capacitor into a current path between said current source and a first voltage reference node to form a potential difference across the capacitor which is dependent on the defined current. In the output configuration, the switching circuitry connects the capacitor between a second voltage reference node and the gate terminal of the sampling transistor so that a voltage level applied at the gate terminal of the sampling transistor is dependent on the defined current.

17 Claims, 13 Drawing Sheets

US 11,689,200 B2

SAMPLING SWITCH CIRCUITS

CROSS-REFERENCE OF RELATED APPLICATIONS

This application claims the benefit of European Patent Application No. 21180456.2, filed on Jun. 18, 2021, the entire disclosure of which Application is incorporated by reference herein.

The present invention relates to sampling switch circuits and circuitry, which may be referred to as sampling circuitry. Sampling switch circuits in line with the present invention may be referred to as sample-and-hold circuits or sample and hold switch circuits.

Voltage mode and current mode sampling is known in general terms, and a sample-and-hold circuit may be considered an example of a voltage mode sampling circuit.

In a typical voltage mode sampler, a sampling transistor such as a field-effect transistor (FET) acts as a simple switch which is ON during a sampling (tracking or output) phase and is OFF during a hold phase. The on-resistance of the device (sampling transistor) depends on the input voltage (e.g. gate-source voltage in the case of a FET) which in turn creates harmonic distortion—i.e. input-dependent distortion. Where the voltage mode sampler is at the front end of an analogue-to-digital converter (ADC), the harmonic distortion may limit the dynamic range of the ADC.

The bootstrap circuit first appeared under the form of a passive level shifter which worked in a continuous mode to provide a proportional-to-input gate voltage. See for example M. Kikushi and M. Takeda, "Distortionless FET switching circuit" U.S. Pat. No. 3,942,039. Later, developments were made to reduce the continuous power dissipation (with the increasing number of implemented switches) and the voltage headroom (with reduction in supply voltages), leading to the widely used bootstrap topology, for example as explored in M. Dessouky and A. Kaiser, "Very low-voltage digital audio TR modulator with 88-dB dynamic range using local switch bootstrapping," IEEE J. Solid-State Circuits, vol. 36. pp. 349-355, March 2001.

The role of the bootstrapping circuit is to maintain a continuous on-resistance of switches by maintaining a constant gate-source voltage Vgs. A previously-considered bootstrapping method will now be explored by way of introduction.

As above, a bootstrapping circuit may be used to provide or apply a constant voltage over the gate-source of the switch (during the sampling or tracking phase) which is—at least, theoretically—independent of the input signal. This reduces or minimizes the input-dependent on-resistance variations of the sampling switch.

FIG. 1 is a schematic diagram of a sampling switch circuit 1, useful for an overall understanding the bootstrapping concept. An input signal $V_{IN}$ is applied to the source (source terminal) of the sampling switch $M_S$, in this case a transistor (in particular, a field-effect transistor). A voltage source $V_0$ (e.g. a battery) is then connected between the source and the gate (gate terminal), via a clock-controlled switch, so that the voltage $V_0+V_{IN}$ is applied to the gate of the sampling switch $M_S$ during the tracking phase where $V_0$ is a constant voltage. The gate is separately connected via another clock-controlled switch to ground (ground supply voltage). A sampling capacitor $C_S$ is connected to the drain (drain terminal) of the sampling switch $M_S$, which serves as the output node of the circuit 1, where an output signal $V_{OUT}$ is produced. The sampling capacitor $C_S$ is connected between the drain and ground.

Normally, $V_0=V_{DD}$ as shown, where $V_{DD}$ is the supply voltage, and this allows a maximum possible gate-source voltage over the device $M_S$ which creates the minimum on-resistance. In FIG. 1, CLK is the sampling clock (clock signal) with a frequency $f_s$.

The operation of the circuit 1 is as follows. When CLK is high (and −CLK is low), the gate of the sampling switch $M_S$ is connected to ground (ground supply voltage). The terms "high" and "low" may refer to voltage levels such as digital voltage levels, for example to $V_{DD}$ and GND (0 V) voltage levels, respectively. The transistor $M_S$ is thus OFF and the circuit 1 is in a hold phase (or stage) where the sampled value (voltage) on the sampling capacitor $C_S$ is held. When CLK is low (−CLK is high), $V_{IN}+V_{DD}$ is applied to the gate of the switch. The transistor $M_S$ is thus ON and the circuit 1 now enters tracking mode (tracking phase or stage) and the voltage across the sampling capacitor $C_S$ tracks the input signal $V_{IN}$. The gate-source voltage in the tracking mode is thus $V_{IN}+V_{DD}-V_{IN}=V_{DD}$, i.e. independent of the input signal $V_{IN}$.

FIG. 2 shows a previously-considered bootstrapped circuit 10, as a detailed implementation of circuit 1, in which the voltage source $V_0$ (in other words, the battery in FIG. 1) is realized with a fairly large capacitor $C_B$.

The operation of the circuit 10 is as follows.

When the sampling clock is high (i.e., CLK=high), transistors $M_5$ and $M_{5t}$ are on which brings down the voltage on node G (i.e. at the gate of the sampling switch $M_S$) to ground. This turns OFF the sampling switch, $M_S$, and the hold phase starts in which the sampled value on the sampling capacitor $C_s$ is held. During this phase (i.e., the hold phase), transistors $M_2$ and $M_7$ are also OFF. The clock signal "−CLK" (which is an inverted version of the clock signal CLK) is low (i.e., −CLK=low). This turns OFF the transistor $M_6$ and turns ON transistor $M_8$. This brings up a voltage at the node Z to the supply, i.e., $V_{DD}$. Since node Z is now connected to $V_{DD}$, transistor $M_4$ is OFF. At the same time, since the voltage at node G is at ground (i.e. has a ground supply voltage), transistor $M_3$ is ON. The transistor $M_1$ is also ON (due to CLK=high). In this case, the capacitor $C_B$ is connected to ground (GND) at its bottom plate and connected to $V_{DD}$ at its top plate. This is thus also called the precharge phase, since as the sample is held on the sampling capacitor $C_S$, the capacitor $C_B$ is precharged to store the voltage $V_{DD}$.

When the sampling clock is low (i.e., CLK=low), the transistors $M_{5,5t}$ are switched OFF and thus node G is disconnected from ground. Transistor $M_8$ is quickly turned OFF and transistor $M_6$ is quickly turned ON (−CLK=high) and connects node X (whose voltage level is at ground at the beginning of this phase) to node Z which in turn brings down the voltage on node Z from $V_{DD}$ to ground. This turns on the transistor $M_4$ and connects node Y to node G. In this case, the voltage on node G starts to rise (since node Y was charged to $V_{DD}$ during the precharge/hold phase). While the voltage on node G is rising, the transistors $M_2$ and $M_7$ start to conduct (in other words, they turn ON). This raises the voltage at node Z and at node X towards the voltage of the input signal, $V_{IN}$. At this point, the voltage at node Y is raised to $V_{DD}+V_{IN}$ (since $V_{DD}$ is the initial voltage over the capacitor $C_B$). This voltage ($V_{DD}+V_{IN}$) is transferred to node G (i.e., the gate of sampling switch, $M_S$). In this case, the gate-source voltage of this switch is $V_{DD}+V_{IN}-V_{IN}=V_{DD}$ which is constant and independent of the input signal $V_{IN}$. As mentioned before, this phase is called the sampling, tracking or output phase, in which the sampling switch $M_S$ is ON and the voltage across the sampling capacitor $C_s$ tracks the input signal $V_{IN}$.

The inventors have considered the operation of circuit 10 of FIG. 2 as described above in relation to ultra-high sampling frequencies. One problem identified by the inventors is that the input impedance at $V_{IN}$ is relatively low, for example looking at the bootstrapping portion of the circuit (the portion responsible for providing the gate voltage to the sampling switch $M_S$, i.e. in FIG. 2, the portion including transistors $M_1$ to $M_8$ and the capacitor $C_B$), leading to relatively high input loading of the sampling switch $M_S$.

It is desirable to address one or more of the above problems, and in particular to provide sampling switch circuits which have improved performance for example at higher speeds of operation. It is desirable to provide improved sampling switch circuits which may be used as a voltage mode sampler front-end for an ADC, e.g. for use in direct RF applications.

According to an embodiment of a first aspect of the present invention, there is provided a sampling switch circuit, comprising an input node, connected to receive an input voltage signal to be sampled, a sampling transistor comprising a gate terminal, a source terminal and a drain terminal, the source terminal connected to the input node, a capacitor, a current source configured to cause a defined current to flow therethrough and switching circuitry configured to switch between a precharge configuration and an output configuration in dependence upon a clock signal. In the precharge configuration, the switching circuitry connects the capacitor into a current path between said current source and a first voltage reference node to form a potential difference across the capacitor which is dependent on the defined current. In the output configuration, the switching circuitry connects the capacitor between a second voltage reference node and the gate terminal of the sampling transistor so that a voltage level applied at the gate terminal of the sampling transistor is dependent on the defined current.

The precharge configuration may be referred to as a hold configuration. The output configuration may be referred to as a sampling configuration. One example of switching between the precharge configuration and the output configuration may be alternating between the precharge configuration and the output configuration.

The first voltage reference node may be configured to provide a first reference voltage signal, and the second voltage reference node may be configured to provide a second reference voltage signal. The first and second reference voltage signals may be DC voltage signals, reference DC voltage signals, constant voltage signals, or constant DC voltage signals. The first and second reference voltage signals may have the same voltage level as one another.

The current source may be a controllable current source and may be configured such that the defined current is dependent on a control signal.

The control signal may comprise a control voltage signal, and the controllable current source may be configured such that the defined current is dependent on a voltage level of the control voltage signal. The control signal may comprise a control digital signal, and the controllable current source may be configured such that the defined current is dependent on a digital value of the control digital signal. The control signal may be the output of a DAC (digital-to-analogue converter) controlled by a control digital signal.

The control voltage signal may be, or may be dependent upon, the input voltage signal.

The controllable current source may comprise at least one transistor connected to control the defined current based on its gate voltage. The at least one transistor of the controllable current source may be connected such that its gate voltage is dependent on the control signal. The controllable current source may comprise a DAC connected to the gate terminal of the at least one transistor.

The controllable current source may comprise a plurality of transistors connected to control the defined current based on their respective gate voltages. The plurality of transistors of the controllable current source may be connected such that their gate voltages are dependent on the control signal.

The defined current, the capacitor, the clock signal and voltage levels at the first and second voltage reference nodes may be configured to cause the difference between voltage levels provided at the gate and source terminals of the sampling transistor when the switching circuitry is in the output configuration to be greater than or equal to the threshold voltage of the sampling transistor.

The capacitor may comprise first and second terminals. The switching circuitry may comprise first and second pairs of switches. The first pair of switches may comprise a first switch connected between the first terminal of the capacitor and the current source, and a second switch connected between the second terminal of the capacitor and the first voltage reference node. The second pair of switches may comprise a third switch connected between the first terminal of the capacitor and the second voltage reference node and a fourth switch connected between the second terminal of the capacitor and the gate terminal of the sampling transistor.

The switching circuitry may be configured such that, in the precharge configuration, the first and second switches are ON and the third and fourth switches are OFF, and, may be configured such that, in the output configuration, the first and second switches are OFF and the third and fourth switches are ON.

The first, second, third and fourth switches may be implemented as transistors, optionally as field-effect transistors.

The current source may comprise at least one transistor, and wherein the third and fourth switches may be larger than the at least one transistor, and optionally larger than the first and second switches.

The fourth switch may be a transistor comprising a gate terminal, a source terminal and a drain terminal. The capacitor may be a first capacitor. The sampling switch circuit may comprise a second capacitor. In the precharge configuration, the switching circuitry may connect the second capacitor to form a given potential difference across the second capacitor. In the output configuration, the switching circuitry may connect the second capacitor between the gate and source terminals of the fourth switch so that a gate-source voltage of the fourth switch is defined by said given potential difference.

The switching circuitry may be configured, in the precharge configuration, to connect the gate terminal of the sampling transistor to a third voltage reference node so that a voltage level applied at the gate terminal of the sampling transistor in the precharge configuration may be dependent on a voltage level provided at the third voltage reference node.

The third voltage reference node may be configured to provide a third reference voltage signal, optionally being a DC voltage signal and optionally having a voltage level for causing the difference between voltage levels provided at the gate and source terminals of the sampling transistor when the switching circuitry is in the precharge configuration to be less than the threshold voltage of the sampling transistor.

The switching circuitry may comprise a holding switch connected between the gate terminal of the sampling transistor and the third reference voltage reference node. The switching circuitry may be configured such that in the precharge configuration the holding switch is ON and in the output configuration the holding switch is OFF. Optionally, the holding switch may be implemented as a transistor.

According to an embodiment of a second aspect of the present invention, there is provided multi-channel sampling circuitry, comprising a plurality of sampling switch circuits according to the aforementioned first aspect of the present invention. Each said sampling switch circuit may be configured to operate based on its own clock signal. The input nodes for said sampling switch circuits may be connected together to form a common input node and may receive the same input voltage signal as one another.

The plurality of channels, and/or the switching circuitry of said channels, may have a common (i.e. share) reference or supply voltages. The plurality of channels, and the switching circuitry of said channels, may have their own respective reference or supply voltages.

According to an embodiment of a third aspect of the present invention, there is provided an analogue-to-digital converter, comprising the sampling switch circuit according to the aforementioned first aspect of the invention, or the multi-channel sampling circuitry according to the aforementioned second aspect of the present invention.

According to an embodiment of a fourth aspect of the present invention, there is provided integrated circuitry, such an IC chip, comprising the sampling switch circuit according to the aforementioned first aspect of the invention, or the multi-channel sampling circuitry according to the aforementioned second aspect of the present invention, or the analogue-to-digital converter according to the aforementioned third aspect of the present invention.

Reference will now be made, by way of example, to the accompanying drawings, of which:

FIG. 1, as mentioned above, is a schematic diagram of a previously-considered sampling switch circuit;

FIG. 2, as mentioned above, shows a previously-considered bootstrapped circuit, as a detailed implementation of the FIG. 1 circuit;

Embodiments of the present invention seek to address the above problems.

Figure 1:
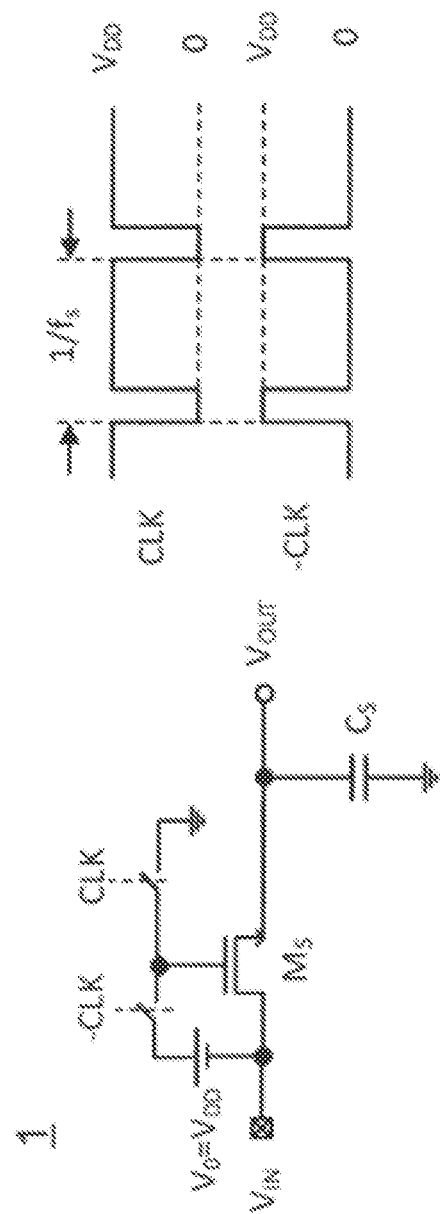
Figure 2:
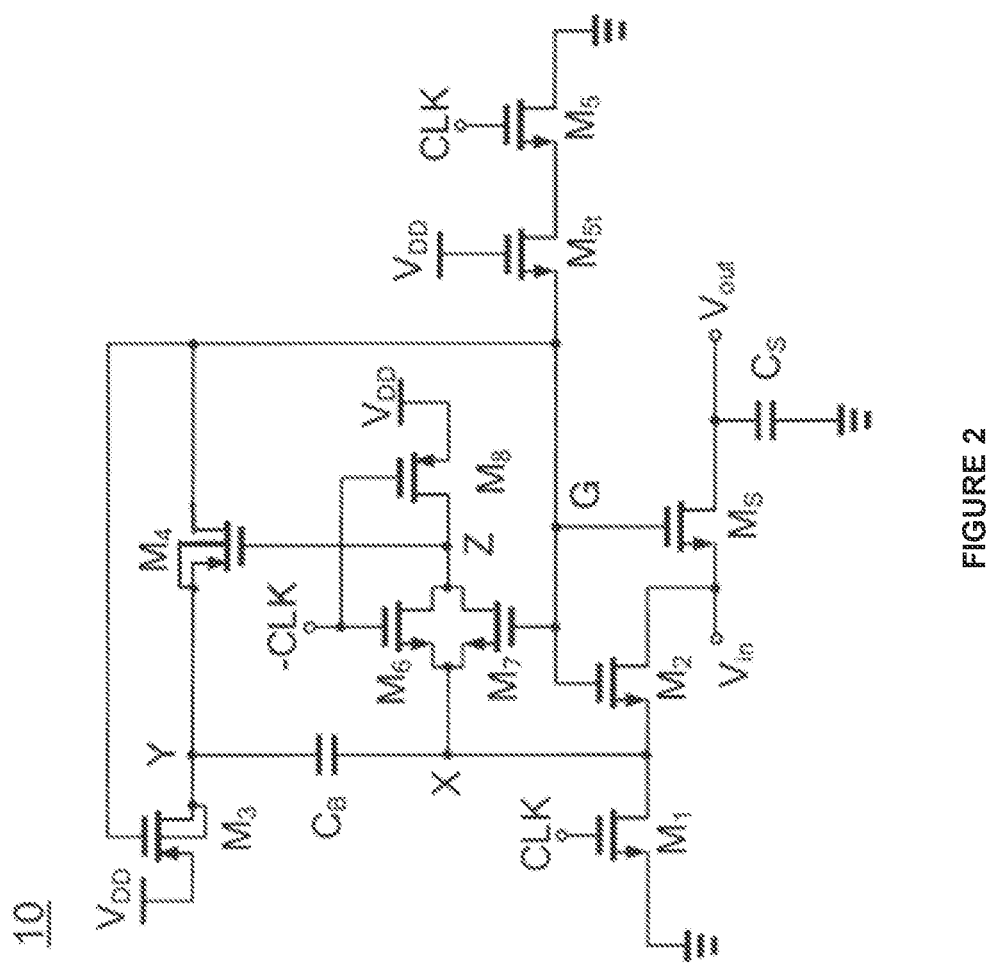

In particular, by way of overview and recalling the discussion of FIGS. 1 and 2, in embodiments described herein input loading of the sampling switch $M_S$ is decreased, which is advantageous in voltage-mode sampling applications. Configurations of the circuit allow for the circuit to operate in two different modes. The first mode allows the circuit to be input referred and operate like a conventional bootstrap circuit but with the advantages described above. The second mode instead uses a reference voltage (or other control signal) rather than being input referred (and can be considered to shift (in this case, increase) a signal's voltage level to be applied to the gate terminal of a sampling transistor $M_S$). Both modes will be considered herein, with both modes providing a high impedance input or high input impedance (to the switching circuitry or bootstrapping portion of the circuit) which allows for use in large arrays.

Figure 3:
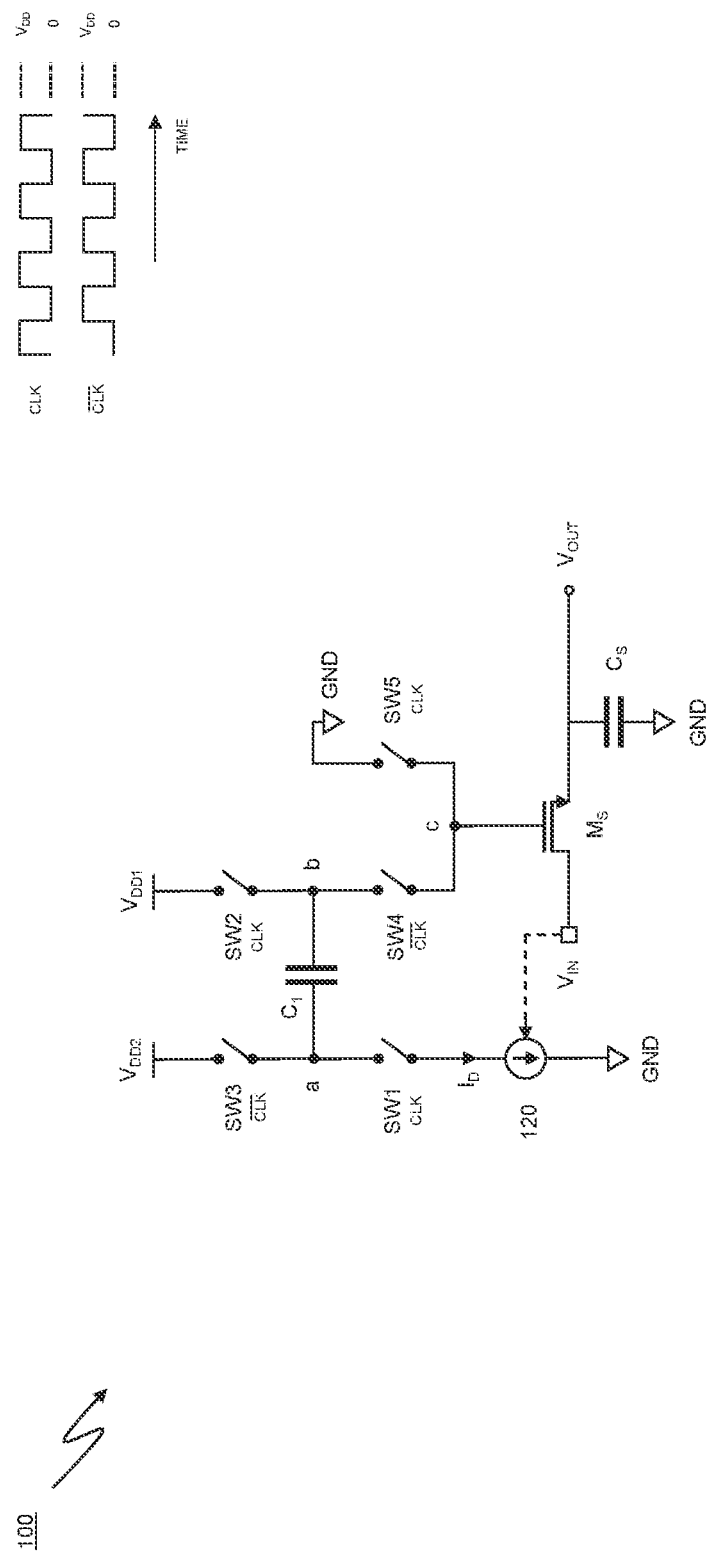
FIG. 3 is a schematic diagram of a sampling switch circuit embodying the present invention.

FIG. 3 is a schematic diagram of a sampling switch circuit 100 embodying the present invention, shown in simplified form. The sampling switch circuit 100 may be referred to for example as a sampling circuit, a sampler circuit, a sampler front-end circuit, an ADC front-end circuit, a sample-and-hold circuit or a sample and hold switch circuit, and the present disclosure will be understood accordingly. Variants of the sampling switch circuit 100, also embodying the present invention, will be considered later herein.

The sampling switch circuit 100 comprises an input node $V_{IN}$, a sampling transistor (sampling switch) $M_S$, a capacitor $C_1$, a current source 120, switching circuitry and an output node $V_{OUT}$.

The input node is connected to receive an input voltage signal $V_{IN}$ to be sampled. The sampling transistor $M_S$ comprises a gate terminal, a source terminal and a drain terminal, the source terminal connected to the input node.

The current source 120 is configured to cause a defined current $I_D$ to flow therethrough. As shown in dashed form, the current source 120 may be a controllable current source and be controlled by the input voltage signal $V_{IN}$ (first mode) so that the defined current $I_D$ is dependent on (e.g. proportional to) the input voltage signal $V_{IN}$. However, this is not essential. For example, the current source 120 may be a non-controllable current source (second mode), such that the defined current $I_D$ is effectively fixed and predefined. As another example, the current source 120 may be a controllable current source and controlled by a control signal different from (e.g. independent of) input voltage signal $V_{IN}$ (second mode).

The capacitor $C_1$ comprises first and second terminals, marked as a and b, and the switching circuitry comprises first to fourth switches, SW1 to SW4, and a fifth switch SW5. The first, second, third and fourth switches may be implemented as transistors, optionally as field-effect transistors. The fifth switch may also be implemented as a transistor, optionally as a field-effect transistor.

The first and second switches SW1 and SW2 may be considered a first pair of switches, and the third and fourth switches SW3 and SW4 may be considered a second pair of switches.

Focusing on the first pair of switches, the first switch SW1 is connected between the first terminal a of the capacitor $C_1$ and the current source 120, and the second switch SW2 is connected between the second terminal b of the capacitor $C_1$ and a first voltage reference node $V_{DD1}$. The current source is connected between the first switch SW1 and a further reference voltage node, which may be considered a ground voltage reference node (GND).

Turning to the second pair of switches, the third switch SW3 is connected between the first terminal a of the capacitor $C_1$ and a second voltage reference node $V_{DD2}$, and the fourth switch SW4 is connected between the second terminal b of the capacitor $C_1$ and the gate terminal of the sampling transistor, marked as node c.

The first voltage reference node $V_{DD1}$ is configured to provide a first reference voltage signal and the second voltage reference node $V_{DD2}$ is configured to provide a second reference voltage signal, which may be DC voltage signals (a DC reference voltage or DC reference voltage signal). The first and second reference voltage signals may have the same voltage level as one another (e.g. the (core) supply voltage VDD), or they may be different. For example, the $V_{DD2}$ voltage level may be higher than the $V_{DD1}$ voltage level. The ground voltage reference node GND is configured to provide a ground reference voltage signal, which may be a DC voltage signal. Nominally, the voltage level at the ground voltage reference node GND may be referred to as 0 V. The (supply) voltage levels at nodes $V_{DD1}$ and $V_{DD2}$ may be referred to as $V_{DD1}$ and $V_{DD2}$ for convenience.

The fifth switch SW5 is connected between the gate terminal of the sampling transistor, node c, and a further reference voltage node, which may also be a ground voltage reference node (GND) as indicated but which in other arrangements may provide a DC voltage signal having a voltage level other than that of ground (i.e. 0 V).

A sampling capacitor $C_S$ is connected to the drain terminal of the sampling switch $M_S$, which serves as the output node, where an output signal $V_{OUT}$ is produced. The sampling capacitor $C_S$ is connected between the drain terminal and a further reference voltage node, which may also be a ground voltage reference node (GND) as indicated. Although the sampling capacitor $C_S$ is indicated as a discrete component in some arrangements it may be a parasitic capacitance.

The sampling switch circuit 100 is configured to operate in (switch between or alternate between) a precharge configuration and an output configuration in dependence upon a clock signal, CLK. In the precharge configuration, the switching circuitry of the sampling switch circuit 100 connects the capacitor $C_1$ into a current path between the current source 120 and the first voltage reference node $V_{DD1}$ to form a potential difference across the capacitor $C_1$ which is dependent on the defined current $I_D$. In the output configuration, the switching circuitry connects the capacitor $C_1$ between the second voltage reference node $V_{DD2}$ and the gate terminal of the sampling transistor so that a voltage level applied at the gate terminal of the sampling transistor, node c, is dependent on the defined current $I_D$.

In order to provide the precharge and output configurations, the first and second switches SW1 and SW2 are connected to be controlled by the clock signal CLK, and the third and fourth switches SW3 and SW4 are connected to be controlled by the clock signal /CLK (which may be referred to as −CLK, clock-bar or inverse clock, and is an inverted version of the clock signal CLK). The fifth switch SW5 is also connected to be controlled by the clock signal CLK.

FIG. 3 also shows example timing diagrams or waveforms of clock signals CLK and /CLK, showing CLK at a high level (marked $V_{DD}$) when /CLK is low (marked as 0), and CLK at a low level when /CLK is high. Both clock signals shown have a duty cycle of 50% (i.e. the clock signal is high for the same proportion of time as it is low) but it can be appreciated that the duty cycle could be any percentage, representing any ratio between the amount of time a clock signal is high and the amount of time the clock signal is low in a given period or cycle.

Figure 3A:
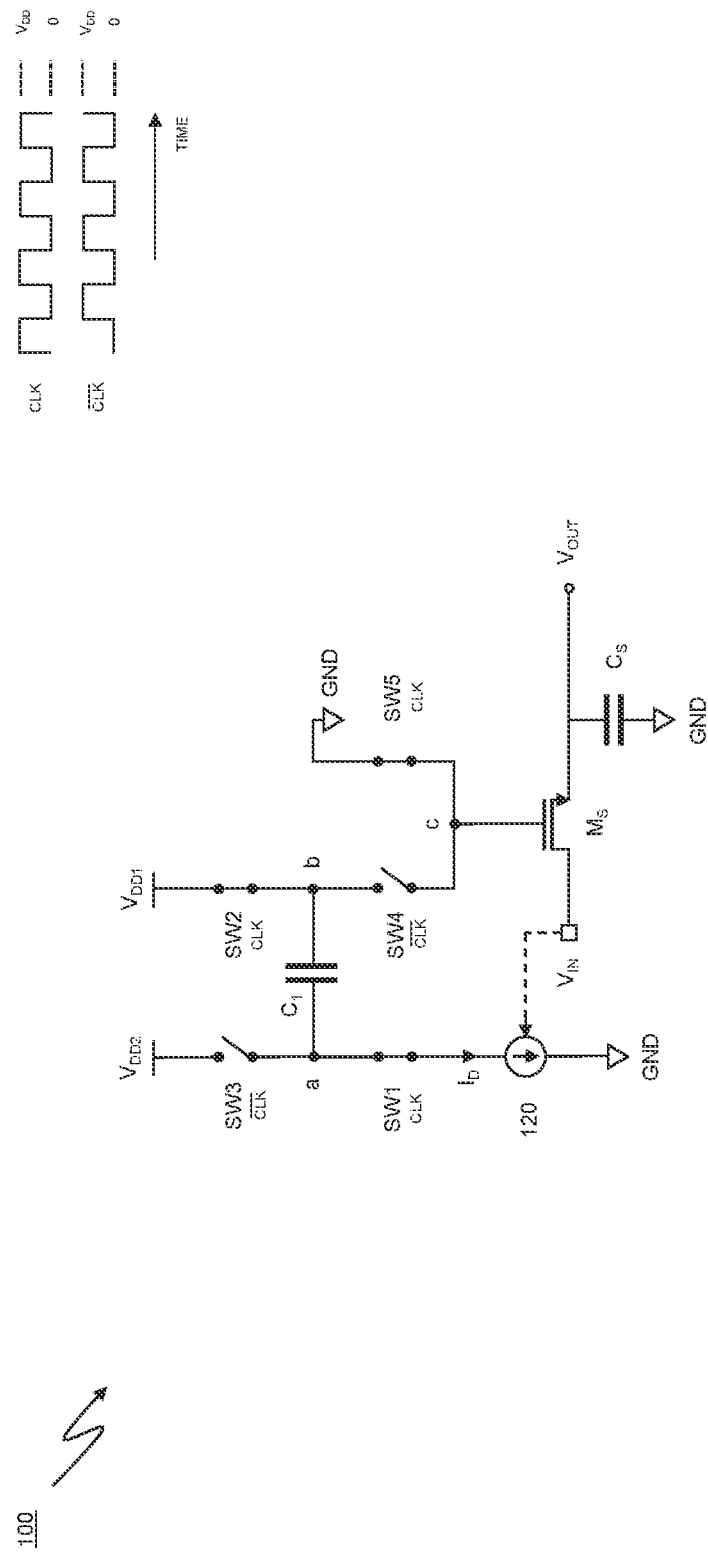
FIG. 3A is a schematic diagram of the FIG. 3 sampling switch circuit in a precharge configuration.

FIG. 3A shows circuit 100 in the precharge configuration. The switching circuitry is configured into the precharge configuration when CLK is high (e.g. $V_{DD}$) and /CLK is low (e.g. GND). In this configuration, the first and second switches SW1 and SW2 are ON and the third and fourth switches SW3 and SW4 are OFF. The fifth switch SW5 is also ON in this configuration.

In the precharge configuration, the capacitor $C_1$ is connected into a current path between the current source 120 and the first voltage reference node $V_{DD1}$. A potential difference forms across the capacitor $C_1$ which is dependent on the defined current $I_D$ as described earlier. This potential difference may form over a series of (multiple) initial precharge configuration periods or cycles, separated by initial output configuration periods or cycles, once the circuit begins operation. This potential difference may also follow any changes in the defined current $I_D$ over multiple precharge configuration periods or cycles, separated by output configuration periods or cycles, during normal operation.

Specifically, the potential difference across the capacitor $C_1$ becomes proportional to the defined current $I_D$. For example, if the defined current $I_D$ were to increase, a voltage $V_a$ at node a would decrease, so that a potential difference $V_{DD1}-V_a$ across the capacitor $C_1$ would increase. The potential difference across the capacitor $C_1$ is controlled in this way based on the defined current $I_D$ for the duration of the precharge configuration.

Since SW5 is also ON, the gate terminal of the sampling transistor $M_S$ is provided with a ground voltage from the ground voltage reference node and the sampling transistor $M_S$ is controlled to be OFF, so that a sample (in the form of a potential difference based on $V_{IN}$ on a previous clock cycle) is held on the sampling capacitor $C_S$.

Figure 3B:
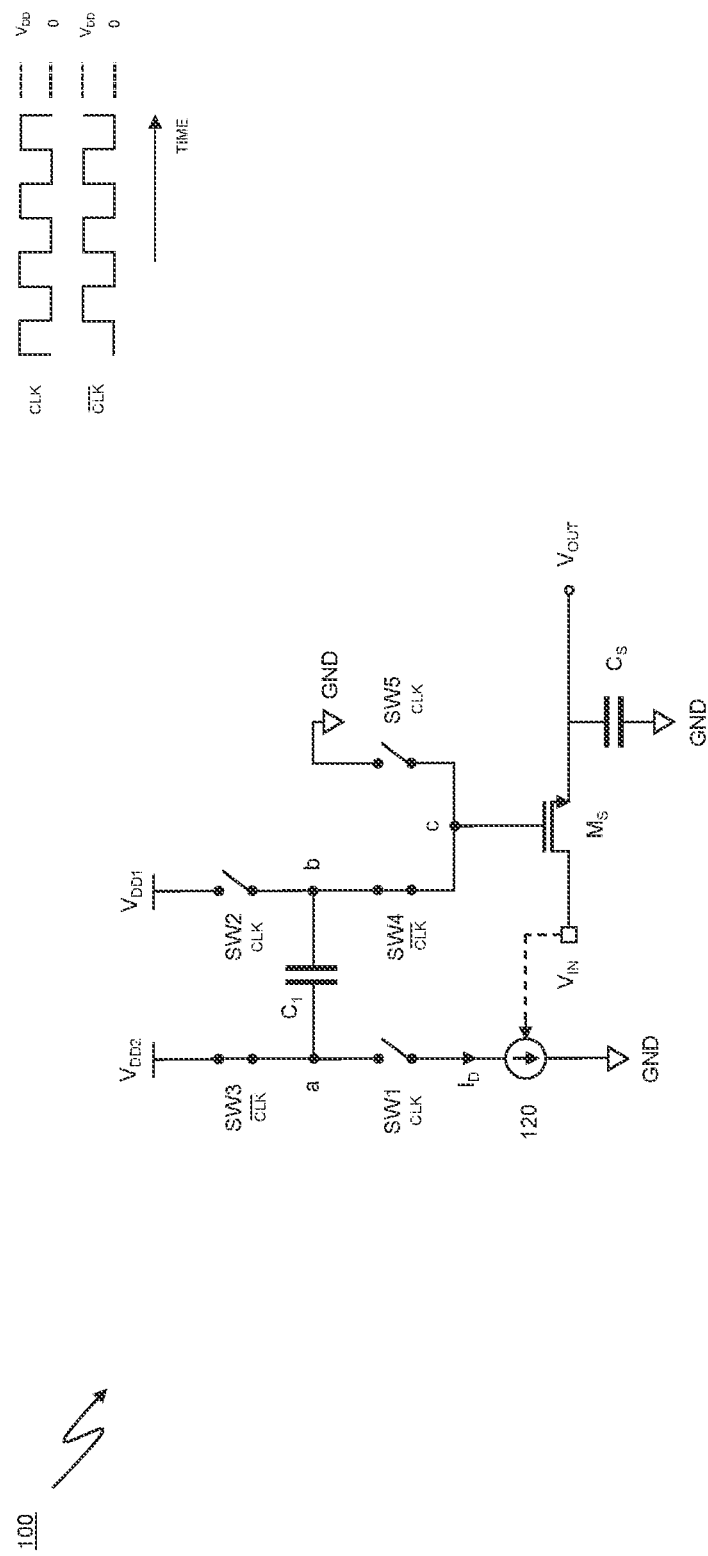
FIG. 3B is a schematic diagram of the FIG. 3 sampling switch circuit in an output configuration.

FIG. 3B shows circuit 100 in the output configuration. The switching circuitry is configured into the output configuration when CLK is low (e.g. GND) and /CLK is high (e.g. $V_{DD}$). In this configuration, the first and second switches SW1 and SW2 are OFF and the third and fourth switches SW3 and SW4 are ON. The fifth switch SW5 is also OFF in this configuration.

Therefore, in the arrangement of FIG. 3B, the gate terminal of the sampling transistor $M_S$ is provided with a voltage level defined by the sum of the potential difference stored across the capacitor $C_1$ and the voltage level $V_{DD2}$. Specifically, the voltage level at the gate terminal of the sampling transistor $M_S$ may be expressed as $V_{DD2}+(V_{DD1}-V_a)$.

The gate-source voltage of the sampling transistor $M_S$ in the output configuration may thus be expressed as $V_{DD2}+(V_{DD1}-V_a)-V_{IN}$. Generally, the defined current, the capacitor, the clock signal and voltage levels at the first and second voltage reference nodes may be configured to cause the difference between voltage levels provided at the gate and source terminals of the sampling transistor when the switching circuitry is in the output configuration to be greater than or equal to the threshold voltage of the sampling transistor. This causes the sampling transistor $M_S$ to turn ON and causes the voltage across the sampling capacitor $C_S$ to track the input signal $V_{IN}$.

As mentioned earlier, the current source 120 may be a controllable current source and be controlled by the input voltage signal $V_{IN}$ (first mode) so that the defined current $I_D$ is dependent on (e.g. proportional to) the input voltage signal $V_{IN}$. In such a case, the voltage $V_a$ may be inversely proportional to $V_{IN}$ so that the gate-source voltage of the sampling transistor in the output configuration ($V_{DD2}$+ ($V_{DD1}$−$V_a$)−$V_{IN}$) becomes substantially independent of $V_{IN}$ (i.e. $V_{GS}$ is constant). That is, while the $V_{GS}$ voltage equation above contains $V_{IN}$, $V_{GS}$ becomes independent of $V_{IN}$ since $V_a$ is inversely proportional to $V_{IN}$. This reduces or minimizes the input-dependent on-resistance variations of the sampling switch.

As also mentioned earlier, however, it is not essential that the current source 120 be a controllable current source, or that it be controlled by the input voltage signal $V_{IN}$. The controllable current source may be configured such that the defined current is dependent on a control signal where the control signal is independent of $V_{IN}$ (second mode). For example, where the current source 120 is a controllable current source and is controlled by a control signal different from (e.g. independent of—in the second mode) input voltage signal $V_{IN}$, the gate-source voltage of the sampling transistor in the output configuration ($V_{DD2}$+($V_{DD1}$−$V_a$)−$V_{IN}$) may retain some dependence on the input voltage signal $V_{IN}$ (i.e. $V_{GS}$ varies with $V_{IN}$). However, this dependence on the input voltage signal $V_{IN}$ may be acceptable in some arrangements.

Whether or not the current source 120 is a controllable current source controlled by the input voltage signal $V_{IN}$, there are advantages associated with the sampling switch circuit 100 as compared to those of FIGS. 1 and 2.

In particular, one advantage is that by using current source 120, even when it is controlled by the input voltage signal $V_{IN}$, input loading of the sampling transistor (sampling switch) $M_S$ is decreased, given a high impedance input to the current source 120 when it is controlled, which for example allows for use in large arrays. Where the current source 120 is controlled by the input voltage signal $V_{IN}$, the high impedance input to the current source 120 reduces the loading at the input node (marked as $V_{IN}$) of the sampling switch circuit 100, since the current source is effectively acting as a buffer.

Further, where the current source 120 is implemented using one or more transistors (as detailed later herein), such transistors (and any transistors used to implement switches SW1 and SW2) can be relatively small since, in the precharge configuration, the gate terminal of the sampling transistor $M_S$ is not being driven. In contrast, any transistors used to implement switches SW3 and SW4 can be relatively large to drive the gate terminal of the sampling transistor $M_S$ effectively without affecting loading at a control input to the current source 120 (or at the input node of the sampling switch circuit 100 where the current source 120 is controlled by the input voltage signal $V_{IN}$).

For similar reasons, and as mentioned earlier, the $V_{DD2}$ voltage level may be higher than the $V_{DD1}$ voltage level, to enable strong driving of the gate terminal of the sampling transistor $M_S$. The $V_{DD1}$ voltage level may be lower than the $V_{DD2}$ voltage level since, in the precharge configuration, the gate terminal of the sampling transistor $M_S$ is not being driven and since the potential difference stored over the capacitor $C_1$ is controlled over multiple precharge cycles as mentioned earlier. In addition, this enables another way to control the voltage level $V_{DD2}$+($V_{DD1}$−$V_a$)−$V_{IN}$, i.e. where $V_{DD2}$≠$V_{DD1}$.

Figure 4:
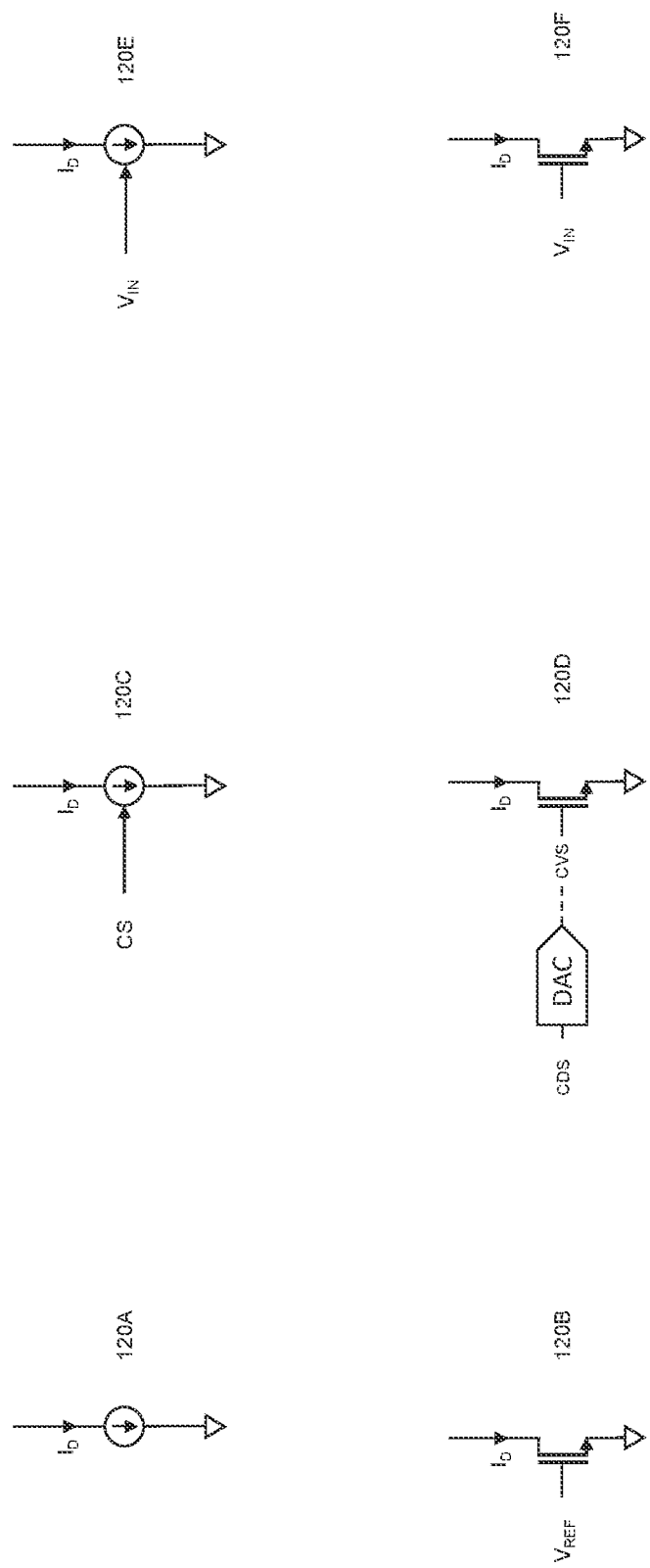
FIG. 4 shows variations of a current source of the FIG. 3 sampling switch circuit.

FIG. 4 shows schematic diagrams useful for understanding possible implementations of the current source 120 of FIG. 3. For simplicity, only the current source connected between SW1 and a ground reference node is shown.

For ease of comparison, FIG. 4 shows a current source 120A which is the same as the current source 120 of FIG. 3 in the case where that current source is not controllable (second mode). Also shown is current source 120B, an implementation of the current source 120A, in this case as a field-effect transistor whose gate terminal is connected to a reference voltage $V_{REF}$ which defines the defined current $I_D$. $V_{REF}$ may be a constant DC voltage signal in order to provide a constant (non-controllable) current.

Alternatively, the current source may be controlled. A control signal may be used to control the current of the current source. The control signal may comprise a control voltage signal (CVS), and the controllable current source may be configured such that the defined current is dependent on a voltage level of the control voltage signal.

FIG. 4 shows a current source 120C representing the current source 120 of FIG. 3 in the case where that current source is controllable by a control signal CS. Also shown is current source 120D, an implementation of the current source 120C. Generally, the controllable current source may comprise at least one transistor connected to control the defined current based on its gate voltage and the at least one transistor of the controllable current source is connected such that its gate voltage is dependent on the control signal. In this case, 120D comprises a field-effect transistor whose gate terminal is connected to a control voltage signal CVS which defines the defined current $I_D$.

The control signal may comprise a control digital signal (CDS), and the controllable current source may be configured such that the defined current is dependent on a digital value of the control digital signal. As indicated by the dashed line in current source 120D, the control voltage signal CVS may be generated by a digital-to-analogue converter (DAC) from a control digital signal CDS. The control voltage signal CVS (and the control digital signal CDS) may be, or may be dependent upon, the input voltage signal $V_{IN}$ (first mode). The control voltage signal CVS (and the control digital signal CDS) may be independent of the input voltage signal $V_{IN}$ (second mode).

FIG. 4 shows a current source 120E representing the current source 120C where the control signal CS is (or is dependent upon) the input voltage signal $V_{IN}$ (first mode). Also shown is current source 120F, an implementation of the current source 120E, in this case as a field-effect transistor whose gate terminal is connected to the input voltage signal $V_{IN}$ which defines the defined current $I_D$. Of course, although not shown, the input voltage signal $V_{IN}$ could be generated by a digital-to-analogue converter (DAC) from a corresponding digital signal in the same or similar way to current source 120D.

As described, the current source may comprise at least one transistor. The third and fourth switches of circuit 100 may be larger than the at least one transistor (of the current source) and optionally may be larger than the first and second switches. The third and fourth switches may be larger in size and therefore larger in gate capacitance than the at least one transistor (of the current source) and optionally the first and second switches. This is so the size of transistors along the various current paths determined by the first and second pair of switches comprise smaller transistors along the signal path in the precharge configuration and larger transistors along the signal path in the output configuration.

Figure 5:
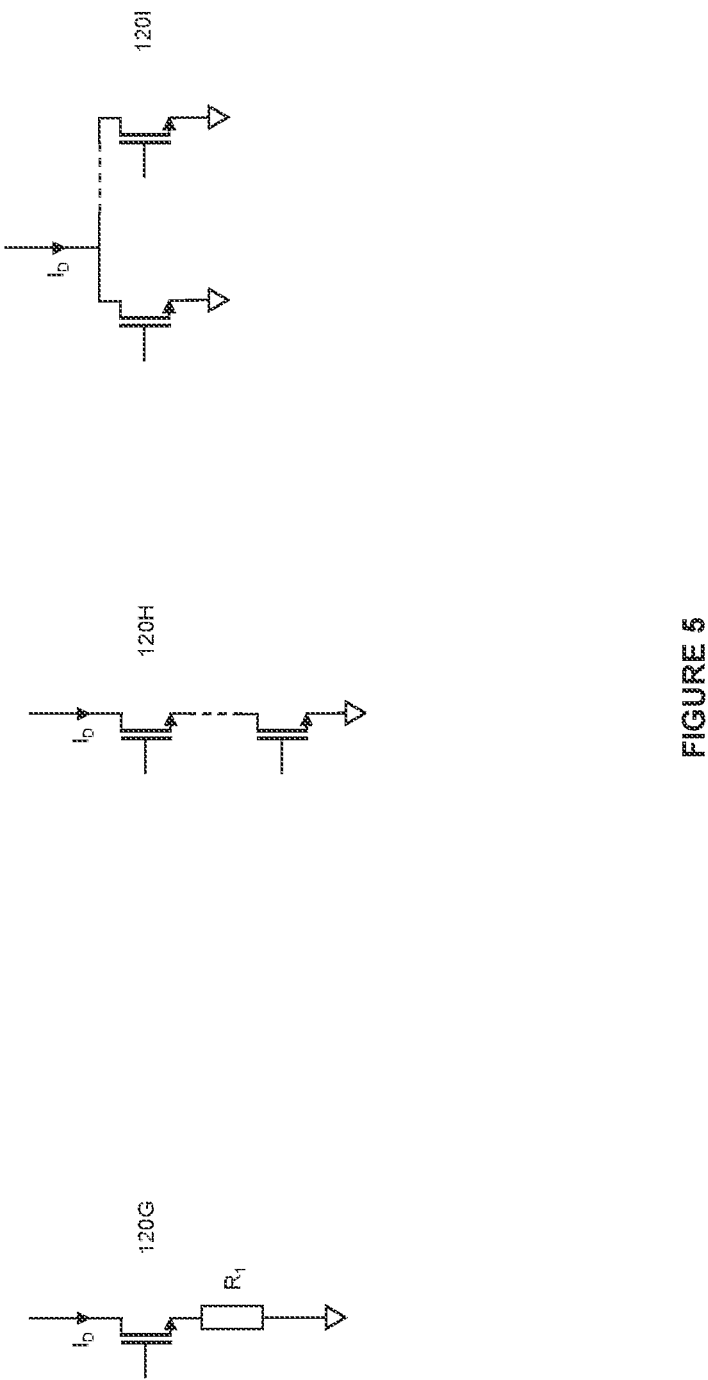
FIG. 5 shows further variations of the current source of the FIG. 3 sampling switch circuit.

FIG. 5 shows schematic diagrams useful for understanding further possible implementations of the current source 120, and indeed of any of the current sources 120B, 120D and 120F.

FIG. 5 shows a current source 120G, implemented as a field-effect transistor as for the current sources 120B, 120D and 120F, simply to indicate that source degeneration may be applied (by virtue of the resistor $R_1$ in series with the source terminal of the transistor).

Generally, the controllable current source may comprise a plurality of transistors connected to control the defined current based on their respective gate voltages and where the plurality of transistors of the controllable current source may be connected such that their gate voltages are dependent on the control signal.

FIG. 5 shows a current source 120H with multiple current sources, implemented as field-effect transistors, connected together in series with their gate terminals being controlled accordingly. The current source 120H may be understood to be a single current source implemented with multiple field-effect transistors. Also shown is current source 120I, indicating that the current sources may be implemented as a parallel arrangement (or array) of field-effect transistors connected together, with their gate terminals being controlled accordingly. All the transistors of the parallel arrangement (or array) are connected between a shared node (i.e. switch SW1) and a shared reference voltage node (i.e. GND). Of course, a combination of series and parallel connections of field-effect transistors may also be employed.

Figure 6:
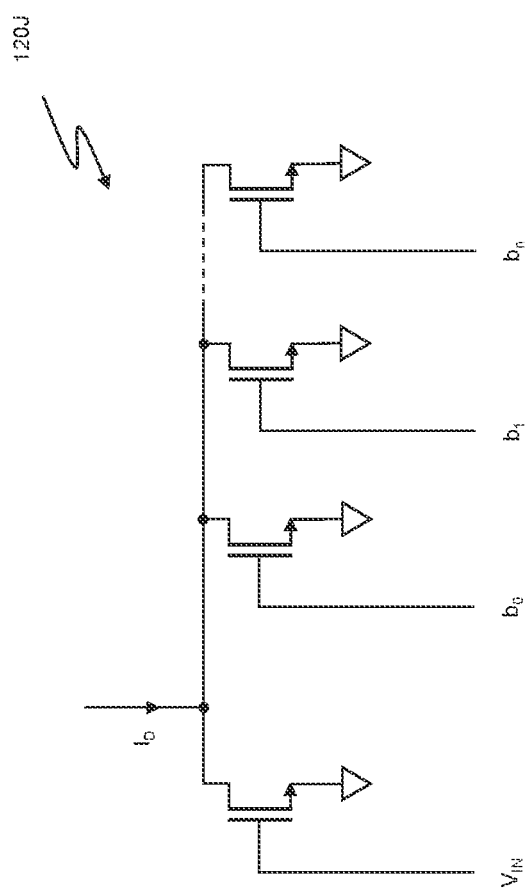
FIG. 6 shows a variation of the current source of the FIG. 3 sampling switch circuit with n-bit digital control.

FIG. 6 is a schematic diagram useful for understanding further possible implementations of the current source 120, and shows a current source 120J implemented as a parallel connection of field-effect transistors in line with current source 120I.

In this case, the current source 120J is a controllable current source whose control signal CS comprises the input voltage signal $V_{IN}$ and example bits b0 to bn of a digital control signal. The left-most transistor is controlled by the input voltage signal $V_{IN}$ with the remaining transistors controlled by bits b0 to bn of the digital control signal. The sizes of the remaining transistors (controlled by bits b0 to bn) may be binary-weighted in line with the binary-weighting of bits b0 to bn. As indicated by the bit bn, and dashed line between the b1 and bn transistors, the digital control signal may have any number of bits, with the total number of transistors being adjusted accordingly.

Implementations 120I and 120J may be useful where digital control over $I_D$ is needed.

An example variation of implementation 120J may comprise respective switches controlled by bit signals b0 to bn, with these switches then controlling (based on the bit values concerned) whether the gates of their corresponding transistors are connected to $V_{IN}$ or to ground GND. In this scenario, all of the gates may be connected to $V_{IN}$ when all of bit signals b0 to bn are selected (i.e. have logic value 1), and when any of the bit signals b0 to bn are disabled (i.e. have logic value 0) their corresponding transistor may have its gate connected to ground GND. It may be that an additional DAC/reference voltage is not available (e.g. due to space, power, number of bootstrap circuits in parallel). In such cases, having the additional parallel devices binary scaled enables the bit signals b0 to bn to be used to implement a current steering DAC. $V_{IN}$ in that case can be common to parallel bootstrap circuits and could be generated by a reference current $I_{REF}$, where $I_{REF}$ can be a controllable current signal. For example, such a reference current $I_{REF}$ may be provided at the drain terminal of a diode-connected field-effect transistor, with its drain terminal connected to ground GND and its gate voltage serving as $V_{IN}$.

Figure 7:
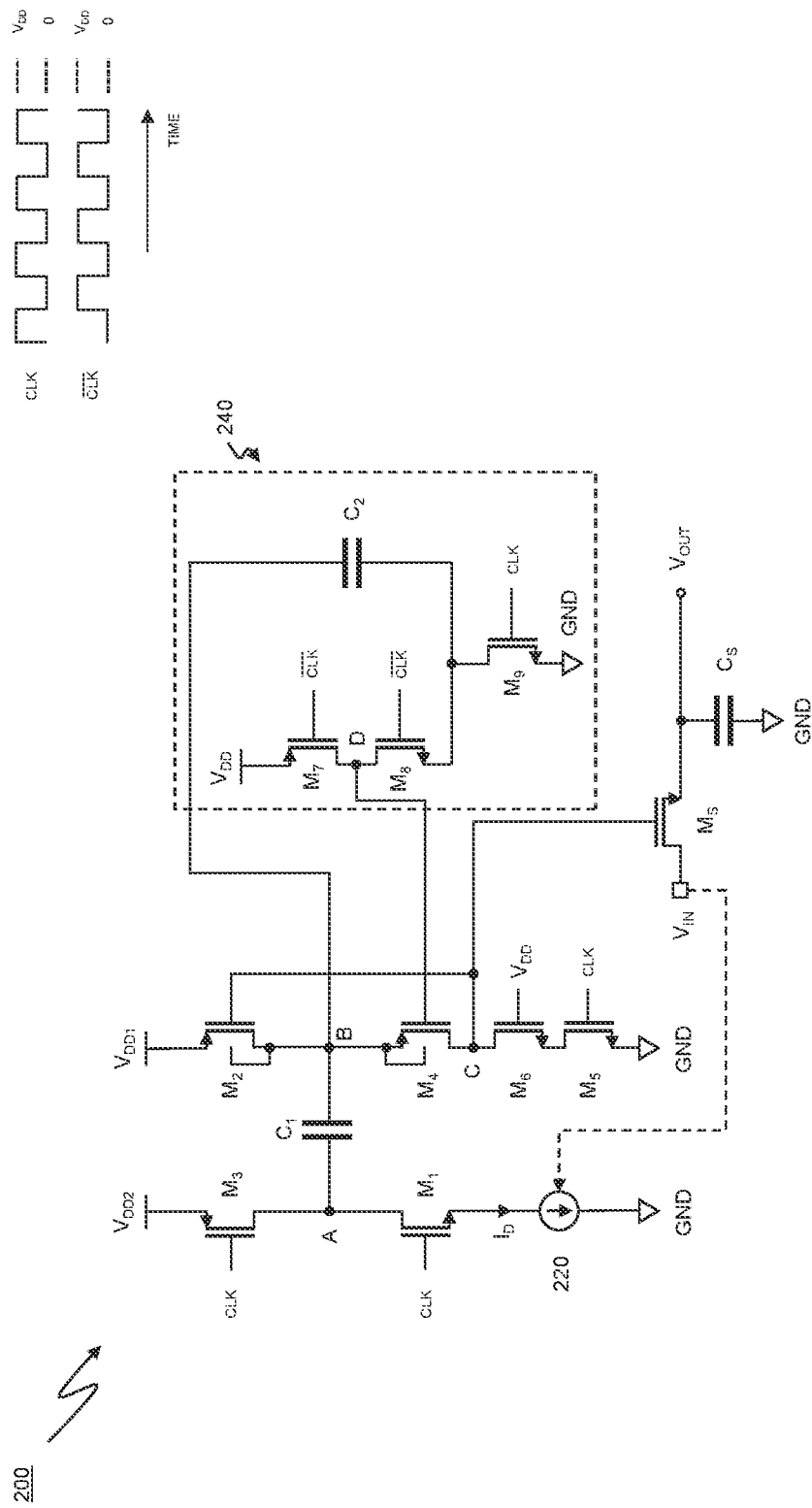
FIG. 7 is a schematic diagram of a sampling switch circuit embodying the present invention.

FIG. 7 is a schematic diagram of a sampling switch circuit 200 embodying the present invention. The sampling switch circuit 200 may be referred to for example as a sampling circuit, a switching circuit, a sampler circuit, a sampler front-end circuit, an ADC front-end circuit, a sample-and-hold circuit or a sample and hold switch circuit, and the present disclosure will be understood accordingly.

The sampling switch circuit 200 may be considered an example implementation of the sampling switch circuit 100, and as such like elements have been denoted with like reference signs. Comparison can be made to FIG. 3 as to the basic structure of the circuit, with components labelled similarly to FIG. 3 for ease of understanding.

The circuit 200 operates in a similar way to that of FIG. 3, as explained above, with the addition of a protection circuit 240 in order to help prevent voltages across a given transistor from exceeding those of a safe-operating range. The protection circuit 240 is indicated by the dashed box surrounding transistors M7 to M9, further voltage reference nodes and capacitor C2. Depending on the application, the protection circuit 240 need not be provided as commented on later.

FIG. 7 will be described in detail. Circuit 200, similarly to circuit 100, comprises an input node $V_{IN}$, a sampling transistor (sampling switch), a capacitor $C_1$, a current source 220, switching circuitry (in the form of transistors $M_1$ to $M_6$) and an output node $V_{OUT}$.

As with FIG. 3, the input node is connected to receive an input voltage signal $V_{IN}$ to be sampled. The sampling transistor $M_S$ comprises a gate terminal, a source terminal and a drain terminal, the source terminal connected to the input node.

The current source 220 is configured to cause a defined current $I_D$ to flow therethrough and may be a controllable or non-controllable current source as previously described, or any of the current source configurations shown in FIGS. 4 to 6.

The capacitor $C_1$ comprises first and second terminals, marked as A and B (corresponding to a and b in FIG. 3O, and may be considered a first capacitor. The switching circuitry comprises first to sixth transistors, $M_1$ to $M_6$. Such transistors are implemented as MOSFETs, but may be any other type of transistor.

The first and second transistors $M_1$ and $M_2$ may be considered a first pair of switches (and be compared to SW1 and SW2 in FIG. 3), and the third and fourth transistors $M_3$ and $M_4$ may be considered a second pair of switches (and be compared to SW3 and SW4 in FIG. 3). The fifth and sixth transistors $M_5$ and $M_6$ may be collectively compared to switch SW5 in FIG. 3. The seventh to ninth transistors $M_7$ to $M_9$ may be considered a protection set of switches, or switches forming part of the protection circuit 240. Each of transistors $M_1$ to $M_9$ comprises a gate terminal, a source terminal and a drain terminal.

In order to fully appreciate the operation of circuit 200 as detailed below, transistors $M_1$ to $M_9$ will be described in terms of N- and P-type MOSFETS, and their operation relative to clock signals CLK and /CLK. In this configuration, an N-type transistor is ON when a gate signal is HIGH or ON and the N-type transistor is OFF when a gate signal is LOW or OFF. A P-type transistor is ON when a gate signal is LOW or OFF and the P-type transistor is OFF when a gate signal is HIGH or ON.

It will be understood that the types of MOSFET and clock signal used may vary together in other implementations (i.e. using clock signal CLK with an N-type transistor, instead of clock signal /CLK with a P-type transistor) in order to achieve the same functionality in a given precharge or output configuration.

Focusing on the first pair of switches, the first transistor $M_1$ is connected between the first terminal A of the capacitor $C_1$ and the current source 220, and the second transistor $M_2$ is connected between the second terminal B of the capacitor $C_1$ and a first voltage reference node $V_{DD1}$. The current source 220 is connected between the first transistor $M_1$ and a further reference voltage node, which may be considered as a ground voltage reference node (GND). Transistor $M_1$ is an N-type transistor, and transistor $M_2$ is a P-type transistor. Transistor $M_1$ has its gate terminal connected to clock signal CLK.

Turning to the second pair of switches, the third transistor $M_3$ is connected between the first terminal A of the capacitor $C_1$ and a second voltage reference node $V_{DD2}$, and the fourth transistor $M_4$ is connected between the second terminal B of the capacitor $C_1$ and the gate terminal of the sampling transistor, marked as node C (corresponding to node c in FIG. 3). Node C is also connected to the gate terminal of transistor $M_2$. Transistors $M_3$ and $M_4$ are P-type transistors. Transistor $M_3$ has its gate terminal connected to clock signal CLK.

As in FIG. 3, the first voltage reference node $V_{DD1}$ is configured to provide a first reference voltage signal and the second voltage reference node $V_{DD2}$ is configured to provide a second reference voltage signal, which may be DC (supply) voltage signals. The voltage levels at nodes $V_{DD1}$ and $V_{DD2}$ may be the same as one another or may be different from one another, as before. The ground voltage reference node GND is configured to provide a ground reference voltage signal, which may be a DC (supply) voltage signal. Nominally, the voltage level at the ground voltage reference node GND may be referred to as 0 V. The (supply) voltage levels at nodes $V_{DD1}$ and $V_{DD2}$ may be referred to as $V_{DD1}$ and $V_{DD2}$ for convenience.

The sixth transistor $M_6$ is connected between the gate terminal of the sampling transistor, node C, and fifth transistor $M_5$, and fifth transistor $M_5$ is connected between the sixth transistor $M_6$ and a third reference voltage node, which may also be a ground voltage reference node (GND) as indicated but which in other arrangements may provide a DC voltage signal having a voltage level other than that of ground (i.e. 0 V).

Transistor $M_5$ (or the combination of the fifth and sixth transistors $M_5$ and $M_6$) may be described as a holding switch connected between the gate terminal of the sampling transistor and the third reference voltage reference node. In the precharge configuration the holding switch is ON and in the output configuration the holding switch ($M_5$) is OFF. The third reference voltage node is configured to provide a third reference voltage signal, optionally being a DC voltage signal and optionally having a voltage level for causing the difference between voltage levels provided at the gate and source terminals of the sampling transistor, when the switching circuitry is in the precharge configuration, to be less than the threshold voltage of the sampling transistor $M_S$. Such a voltage causes the sampling transistor $M_S$ to be OFF.

Transistor $M_5$ represents SW5 of FIG. 3, and transistor $M_6$ is placed between node C and $M_5$ in order to protect transistor $M_4$, since a drain-source voltage over transistor $M_4$ may exceed the safe-operating range of the transistor where a relatively large voltage charged on the capacitor $C_1$ is seen at the source terminal of transistor $M_4$ and a relatively low voltage (i.e. GND) is seen at the drain terminal of transistor $M_4$ through transistor $M_5$. Transistors $M_5$ and $M_6$ are N-type transistors. Transistor $M_5$ has its gate terminal connected to clock signal CLK and transistor $M_6$ has its gate terminal connected to a constant voltage supply $V_{DD}$.

The protection set of switches $M_7$ to $M_9$, alongside further reference nodes and capacitor $C_2$ form protection circuit 240. Capacitor $C_2$ may be described as a second capacitor. Capacitor $C_2$ is connected between node B and transistor $M_9$, where transistor $M_9$ is also connected to a further reference node (i.e. GND). Transistor $M_8$ is connected between transistor $M_9$ and the gate terminal of transistor $M_4$, marked as node D. Transistor $M_7$ is connected between node D and a further reference voltage node $V_{DD}$. In the same way that switching circuit 100 may be considered a bootstrap circuit of the sampling transistor $M_S$, protection circuit 240 may be considered a bootstrap circuit for transistor $M_4$. Transistor $M_7$ is a P-type transistor, and transistors $M_8$ and $M_9$ are N-type transistors. Transistors $M_7$ and $M_8$ have their respective gate terminals connected to clock signal /CLK and transistor $M_9$ has its gate terminal connected to clock signal CLK.

As in FIG. 3, a sampling capacitor $C_S$ is connected to the drain terminal of the sampling switch $M_S$, which serves as the output node, where an output signal $V_{OUT}$ is produced. The sampling capacitor $C_S$ is connected between the drain terminal and a further reference voltage node, which may also be a ground voltage reference node (GND) as indicated. Although the sampling capacitor $C_S$ is indicated as a discrete component in some arrangements it may be a parasitic capacitance.

The circuit 200, similar to the circuit 100, is configured to operate in (switch between, or alternate between) a precharge configuration and an output configuration in dependence upon the clock signal, CLK. In the precharge configuration, the switching circuitry of the sampling switch circuit 200 connects the capacitor $C_1$ into a current path between the current source 220 and the first voltage reference node $V_{DD1}$ to form a potential difference across the capacitor $C_1$ which is dependent on the defined current $I_D$. In the output configuration, the switching circuitry connects the capacitor $C_1$ between the second voltage reference node $V_{DD2}$ and the gate terminal of the sampling transistor so that a voltage level applied at the gate terminal of the sampling transistor, node C, is dependent on the defined current $I_D$.

When CLK is high (e.g. $V_{DD}$) and /CLK is low (e.g. GND), the switching circuitry is configured into the precharge configuration.

In this configuration, the first transistor $M_1$ is ON and the third transistor $M_3$ is OFF. The fifth and sixth transistors $M_5$ and $M_6$ are both ON, and so the switching circuitry is configured to connect the gate terminal of the sampling transistor to the third voltage reference node so that a voltage level applied at the gate terminal of the sampling transistor in the precharge configuration is dependent on a voltage level provided at the third voltage reference node. In FIG. 7, node C is provided with a ground voltage (i.e. GND) through transistors $M_5$ and $M_6$. The ground voltage at node C turns ON transistor $M_2$, providing node B with a voltage $V_{DD1}$, and providing a first terminal of capacitor $C_2$ with voltage $V_{DD1}$. Transistor $M_7$ is ON and transistor $M_6$ is OFF, and so node D is provided with voltage $V_{DD}$ through transistor $M_7$ and turns transistor $M_4$ OFF. Transistor $M_9$ is ON and provides a ground voltage to a second terminal of capacitor $C_2$.

In this arrangement, the gate terminal of the sampling transistor $M_S$ is therefore provided with a ground voltage through node C and the sampling transistor $M_S$ is controlled to be OFF, so that a sample (in the form of a potential difference based on $V_{IN}$ from the previous clock cycle) is held on the sampling capacitor $C_S$.

Also in the precharge configuration, the capacitor $C_1$ is connected into a current path between the current source 220 and the first voltage reference node $V_{DD1}$. A potential difference forms across the capacitor $C_1$ which is dependent on the defined current $I_D$ as described earlier. Specifically, the potential difference across the capacitor $C_1$ becomes proportional to the defined current $I_D$. For example, if the defined current $I_D$ were to increase, a voltage $V_A$ at node A would decrease, so that a potential difference $V_{DD1}-V_A$ across the capacitor $C_1$ would increase.

The switching circuitry connects the second capacitor $C_2$ to form a given potential difference across the second capacitor. Capacitor $C_2$ is connected into a current path between node B (provided with a first reference voltage $V_{DD1}$) and ground voltage through transistor $M_9$, and $C_2$ charges to voltage $V_{DD1}$.

When CLK is low and /CLK is high, the switching circuitry is configured into the output configuration.

In this configuration, the first transistor $M_1$ is OFF and the third transistor $M_3$ is ON. The fifth transistor $M_5$ is OFF (the sixth transistor $M_6$ remains ON), and so node C is no longer provided with a ground voltage (i.e. GND). Transistor $M_7$ is OFF, transistor $M_6$ is ON, and transistor $M_9$ is OFF and so transistor $M_9$ no longer provides a ground voltage to the second terminal of capacitor $C_2$. Node D is thus connected to the second terminal of capacitor $C_2$, and the switching circuitry connects the second capacitor $C_2$ between the gate (node D) and source (node B) terminals of the fourth transistor (switch) $M_4$ so that a gate-source voltage of the fourth transistor (switch) $M_4$ is defined by the potential difference stored across the second capacitor $C_2$ at the end of the precharge phase, and becomes effectively $-V_{DD1}$ which turns the fourth transistor (switch) $M_4$ ON.

In this arrangement, the gate terminal (node C) of the sampling transistor $M_S$ is provided with a voltage $V_{DD2}+(V_{DD1}-V_A)$ through transistor $M_4$ and node C (turning OFF transistor $M_2$), and the sampling transistor $M_S$ is controlled to be ON so that a sample (in the form of a potential difference from $V_{IN}$) is tracked at the drain terminal of the sampling transistor $M_S$ and at the sampling capacitor $C_S$.

Note that if the protection circuit 240 were removed and the gate terminal of the fourth transistor (switch) $M_4$ were driven by the clock signal CLK, then the magnitude of the gate-source voltage of the fourth transistor (switch) $M_4$ in this arrangement would become $V_{DD2}+(V_{DD1}-V_A)$, i.e. the same as the voltage level at node B, and this may be beyond the operating limit for gate-source voltage of the fourth transistor (switch) $M_4$. By providing the protection circuit 240 the magnitude of the gate-source voltage of the fourth transistor (switch) $M_4$ in this arrangement becomes $V_{DD1}$ as above, keeping that gate-source voltage within acceptable limits. In some arrangements, as mentioned earlier, it may be that the protection circuit 240 is unnecessary and the gate terminal of the fourth transistor (switch) $M_4$ may be driven by the clock signal CLK.

As with circuit 100, in circuit 200, the gate-source voltage of the sampling transistor $M_S$ in the output configuration may be expressed as $V_{DD2}+(V_{DD1}-V_A)-V_{IN}$. Also as with circuit 100, in circuit 200 the current source 220 may be a controllable current source and be controlled by the input voltage signal $V_{IN}$ (first mode) so that the defined current $I_D$ is dependent on (e.g. proportional to) the input voltage signal $V_{IN}$. In such a case, the voltage $V_A$ may be inversely proportional to $V_{IN}$ so that the gate-source voltage of the sampling transistor in the output configuration ($V_{DD2}+(V_{DD1}-V_A)-V_{IN}$) becomes substantially independent of $V_{IN}$ (i.e. $V_{GS}$ is constant). Similarly to before, it is not essential that the current source 220 be a controllable current source, or that it be controlled by the input voltage signal $V_{IN}$. The controllable current source may be configured such that the defined current is dependent on a control signal where the control signal is independent of $V_{IN}$ (second mode). For example, where the current source 220 is a controllable current source and is controlled by a control signal different from (e.g. independent of—in the second mode) input voltage signal $V_{IN}$, the gate-source voltage of the sampling transistor in the output configuration ($V_{DD2}+(V_{DD1}-V_A)-V_{IN}$) may retain some dependence on the input voltage signal $V_{IN}$ (i.e. $V_{GS}$ varies with $V_{IN}$). However, as before, this dependence on the input voltage signal $V_{IN}$ may be acceptable in some arrangements.

Focusing on the first mode, where the current source 220 is controlled by the input voltage signal $V_{IN}$, the voltage at the gate of the sampling transistor ($V_{DD2}+(V_{DD1}-V_A)$) has a dependence on $V_{IN}$ through $V_A$ as above. This dependent component ($V_A$) was charged on capacitor $C_1$ in the precharge configuration clock cycle, i.e. at a time prior to the subsequent output configuration clock cycle when the input voltage signal $V_{IN}$ affects the voltage stored on the sampling capacitor $C_S$. This component may be described as $V_{IN,T-1}$, the value dependent on $V_{IN}$ at the precharge configuration period prior to the output configuration. A small discrepancy can arise between the input signal $V_{IN}$ and the value of $V_{IN,T-1}$ since the input signal $V_{IN}$ and the component of $V_{IN}$ on the gate terminal are taken from different clock cycles (specifically, half clock cycles). Put another way, the value of $V_{IN}$ can change slightly between the precharge and output configurations, and the value of $V_{IN}$ at the source terminal of the sampling transistor $M_S$ can be different from (or out of phase with) the component of $V_{IN}$ seen at the gate terminal of the sampling transistor $M_S$, introducing an error. However, it will be appreciated that where the clock frequency is (much) greater than the input signal frequency, such a discrepancy may be considered negligible, and in any event the error may be non-critical in some applications.

In bootstrapping circuits akin to that of FIG. 2, a capacitor may be used to charge up to a supply voltage $V_{DD}$ before $V_{IN}$ is added and applied to the gate of the sampling transistor. In comparison to such circuits, the capacitor $C_1$ in FIGS. 3 and 7 is first charged to a value based on $V_{IN}$ and then $V_{DD}$ (specifically, $V_{DD2}$) is added. The benefit of this implementation, alongside the increased input impedance and reduced signal loading described previously, arises since smaller (lower capacitance) transistors may be used for the $V_{IN}$ signal path during the precharge configuration, while larger (higher capacitance) transistors may be used on the output path during the output configuration when the sampling transistor $M_S$ is driven. This allows the circuit to operate at higher frequency and over a wider bandwidth.

As mentioned above, and for the avoidance of any doubt, the transistors herein may be implemented as field-effect transistors, or any other type of transistor. The transistors may be implemented as MOSFET type transistors.

The disclosure also extends to multi-channel sampling circuitry, comprising a plurality of sampling switch circuits. Said plurality of sampling switch circuits may correspond to multiple channels arranged for time-interleaved operation. It will be appreciated that such a configuration may be useful as the front-end of a time-interleaved ADC.

Figure 8:
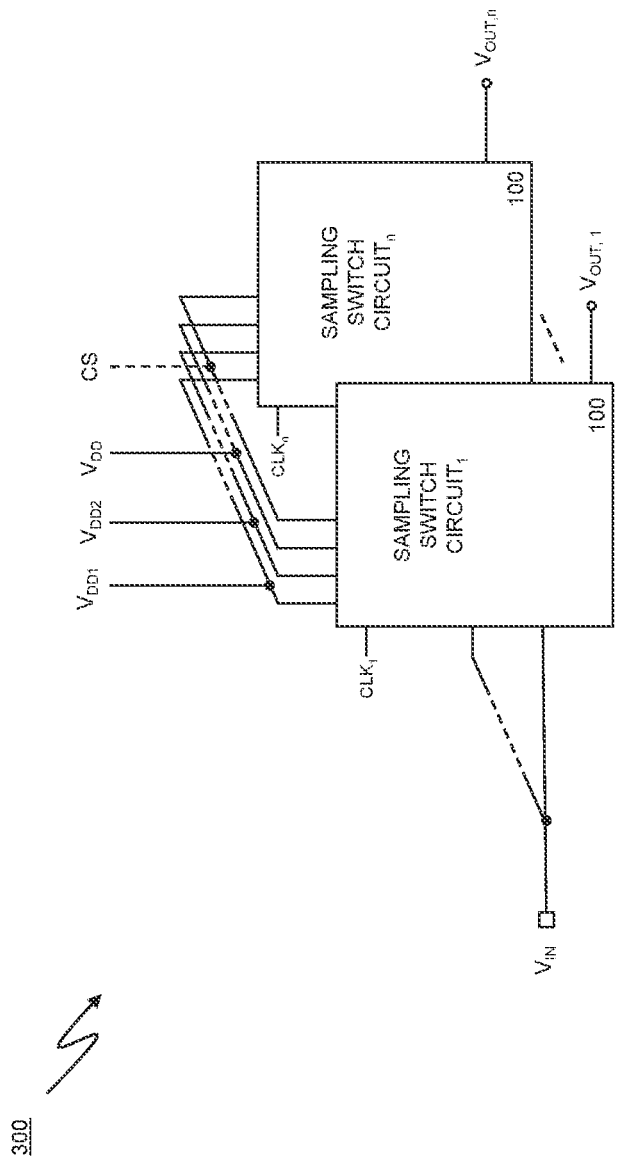
FIG. 8 is a schematic diagram of a multi-channel sampling switch circuit embodying the present invention.

FIG. 8 shows an example of a multi-channel sampling circuit 300. Each channel may have its own sampling switch circuit, shown as sampling switch circuit 100 for simplicity, where n corresponds to the number of channels. The input nodes $V_{IN}$ of the channels may be connected together to form a common input node $V_{IN}$ (as shown) and receive the same input voltage signal as one another. It will be appreciated the multi-channel sampling circuit may have any number of channels n.

The first and second reference voltages $V_{DD1}$ and $V_{DD2}$, and supply voltage $V_{DD}$ may be common to (i.e. shared between) the different channels, as shown in FIG. 8, or each channel may have its own first and second reference voltages $V_{DD1}$ and $V_{DD2}$, and supply voltage $V_{DD}$. As above, in some arrangements $V_{DD1}$ and $V_{DD2}$ may both equal $V_{DD}$ in which case only the supply voltage $V_{DD}$ need be provided.

As before, the switching circuitry of each sampling switch circuit may comprise a controllable or non-controllable current source. FIG. 8 shows (optional) control signal CS as a common (shared) input to the switching circuitry of channels 1 to n. The control signal CS input may be omitted, individually connected to each channel, or be replaced by a connection to the input signal $V_{IN}$, such that the controllable current source in each channel is configured to be controlled by $V_{IN}$.

Each channel has its own output node and its own corresponding sampling capacitor $C_{S,n}$ (not shown).

Each channel's switching circuitry may be controlled by its own clock signal CLK, and its own inverted clock signal /CLK (not shown). If the clock signals $CLK_1$ to $CLK_n$ (corresponding to channels 1 to n) are a set of time-interleaved clock signals, then the channels 1 to n will sample the input signal $V_{IN}$ in a time-interleaved fashion. That is, multiple sampling switches ($M_{S,1}$, $M_{S,2}$, ..., $M_{S,n}$—not shown) are driven with n switching circuits (not shown) which are driven with n sampling clocks ($CLK_1$, $CLK_2$, ... $CLK_n$). It will be appreciated that the clocks CLK and /CLK may vary in their frequency and duty-cycle with respect to the timing diagrams shown in the top right corner of FIG. 3, for use in such a multi-channel configuration.

It will be appreciated that any of the single-channel sampling switch circuit configurations disclosed herein (circuits 100 or 200), or variations of those circuits using any current-source configuration of FIGS. 4 to 6, could be used as the basis of a multi-channel configuration.

As detailed above, the current source may be connected to the input signal $V_{IN}$, or may be connected to a control signal CS, or even a constant reference supply voltage. This results in effectively two distinct modes of operation, which can be better understood with reference to FIGS. 9 and 10.

Figure 9:
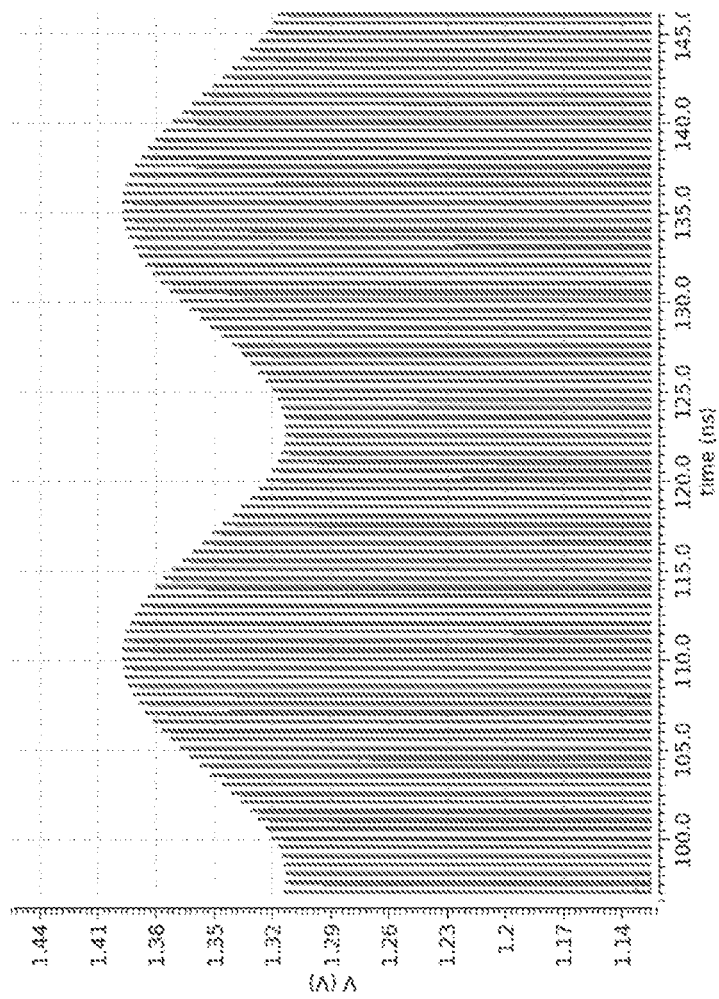
FIG. 9 shows a plot of the voltage signal at the gate terminal of the sampling switch of the FIG. 7 sampling switch circuit overtime, during a first mode of operation.

FIG. 9 shows a graph of voltage signal at node C of circuit 200 when it is operating in the first mode, where the current source is controlled by the input signal $V_{IN}$. In this mode, the circuit operates in a similar way to the bootstrap circuit of FIG. 2. As can be seen from the figure, the voltage seen at node C (and the voltage applied to the gate terminal of the sampling transistor $M_S$) tracks an example input signal $V_{IN}$, in this case a sine wave. Assuming the example input signal $V_{IN}$ has a DC bias voltage of ~450 mV, and by applying ~0.9V for $V_{DD2}$, the DC bias voltage at node C can be seen to have increased to a voltage of approximately 1.35V. Hence, the gate-source voltage $V_{GS}$ for the sampling transistor $M_S$ becomes around 0.9V (1.35-0.45).

As can be seen by considering the graph in detail, the voltage level alternates between a peak tracking the input signal $V_{IN}$ and 0 V, corresponding to the output configuration (sampling/tracking phase) and precharge configuration (hold-phase), respectively. This corresponds with the clock signals CLK and /CLK, and where in the precharge configuration the voltage seen at C is 0 V and the output configuration where the voltage at node C ($V_{DD2}+(V_{DD1}-V_A)$) is proportional to the input signal.

Figure 10:
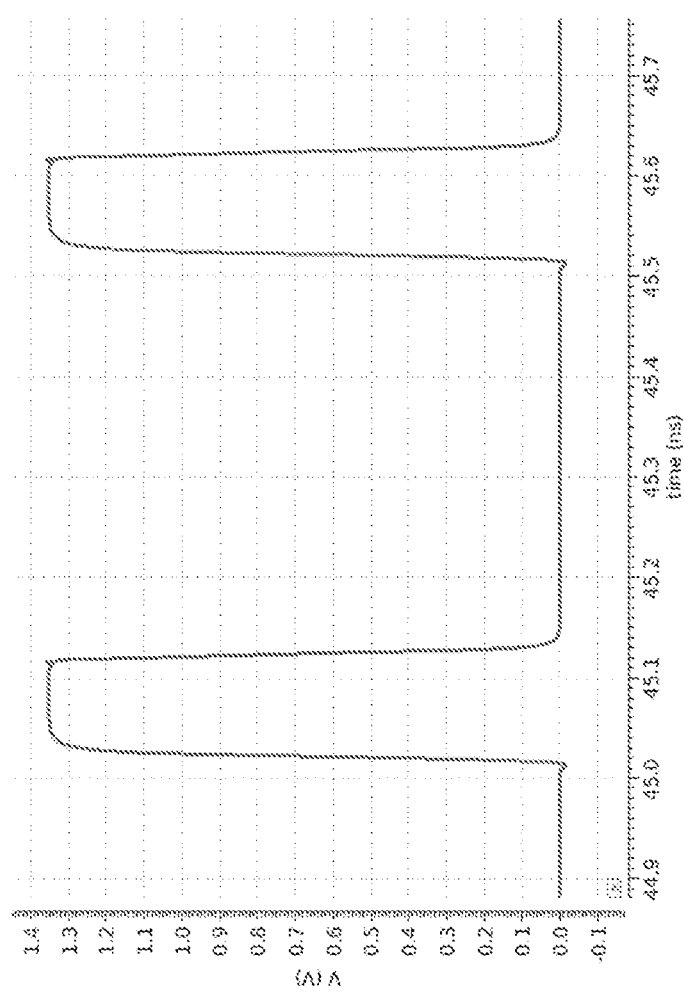
FIG. 10 shows a plot of the voltage signal at the gate terminal of the sampling switch of the FIG. 7 sampling switch circuit over time, during a second mode of operation.

FIG. 10 shows a graph of voltage signal at node C of circuit 200 when it is operating in the second mode, where the current source is controlled by a (constant) reference voltage or control signal. Instead of the voltage signal at node C tracking the same example input signal $V_{IN}$ as for FIG. 9, the peaks can be seen to be the same height in each cycle, representing a constant peak voltage. Since the reference or control signal controlling the current source is constant, $V_A$ remains the same and the capacitor $C_1$ is always charged to the same voltage level. The voltage provided at node C is therefore the same and independent of $V_{IN}$ changing over time since $V_{IN}$ does not control the current source.

The circuit 200 configured to operate in the second mode may be useful in some cases. For example, maintaining a constant $V_{GS}$ across the sampling switch $M_S$ helps with switch ON resistance variation across the swing of the input signal $V_{IN}$ when charging capacitor $C_S$. When the signal swing is small enough but the common mode of the input signal $V_{IN}$ is mid-rail, for example, when $V_{IN}$ swing is ~300 mV, but common mode is 500 mV (or higher) and thus $V_{GS}$ on $M_S$ varies from 250 mV to 750 mV, a $V_{GS}$ of 250 mV can prove to be extremely small. In these cases, by level-shifting the gate signal for $M_S$ by 250 mV it provides a $V_{GS}$ of 500 mV to 900 mV. If the $M_S$ device is sized accordingly, this can be sufficient to avoid distortion (with the second mode reducing load on $V_{IN}$, i.e. removing loads from the signal path). In addition, this level shifts the gate signal for $M_S$ above $V_{DD2}$ when a supply larger than $V_{DD2}$ or $V_{DD1}$ is not available. This again reduces the ON resistance of the switch $M_S$ allowing the switch $M_S$ to be implemented as only one NMOS (instead of, for example, a complementary switch where PMOS and NMOS devices are used in parallel and there is increased loading on the input signal $V_{IN}$).

Of course, in the second mode the gate voltage of the sampling transistor $M_S$, and therefore its gate source voltage $V_{GS}$, is no longer independent of $V_{IN}$, since there is no longer a $V_{IN}$ component present in said gate voltage. However, in certain applications such as in the example above, this may be acceptable.

FIG. 10 could of course be interpreted to relate to the first mode where $V_{IN}$ has a constant value, and thus all the peaks, representing the voltage at node C over time, are equal.

As mentioned above, a sampling switch circuit embodying the present invention may be implemented as part of an ADC, for example as its front-end to generate voltage mode samples $V_{OUT}$ of an input signal $V_{IN}$ at a sample rate defined by a clock signal CLK as described earlier.

In summary, the above circuits are examples of a sample and hold bootstrap circuit where node A (or, in FIG. 3, node a), proportional to $V_{IN}$ is sampled during the pre-charge configuration and used as a reference voltage for the output configuration. Bootstrap circuits akin to that of FIG. 2 precharge a capacitor to a supply voltage ($V_{DD}$) and then, after the capacitor has been charged, $V_{IN}$ is added. In the topology of FIGS. 3 and 7, however, the capacitor is precharged to a voltage proportional to $V_{IN}$ and then the supply voltage ($V_{DD}$ or $V_{DD2}$) is added.

As will now be apparent, the capacitor $C_1$ in circuits 100 and 200 represents the capacitor of a bootstrap circuit akin to that of FIG. 2, and capacitor $C_2$ acts as a bootstrap capacitor for transistor $M_4$ helping it to remain within its Safe-Operating-Region.

If the circuit is used in the first mode, the frequency of $V_{IN}$ may be lower than that of the clock CLK. The difference in frequency between the two signals is defined by the maximum output on-resistance variation of the sampling transistor $M_S$. The voltage at node C is proportional to the sampled signal during the pre-charge and thus at the beginning of the tracking period, a discrepancy arises between the value of $V_{IN}$ at the source terminal of the sampling transistor $M_S$ and component $V_{IN}$ at the gate terminal of the sampling transistor $M_S$. The discrepancy is proportional to the difference between the input voltage signal $V_{IN}$ in the precharge configuration and in the subsequent output configuration.

The circuits described above relate to a dual-purpose switching circuit, comprising two modes of operation. The first mode relating to current source operation by tracking $V_{IN}$, and the second mode relating to current source operation by using a constant control signal.

Benefits of the circuit can include a reduced load on the input signal, aided by what is effectively a buffer stage in the form of current source 120 or 220. Input resistance can be relaxed and can be in the order of kOhms.

Figure 11:
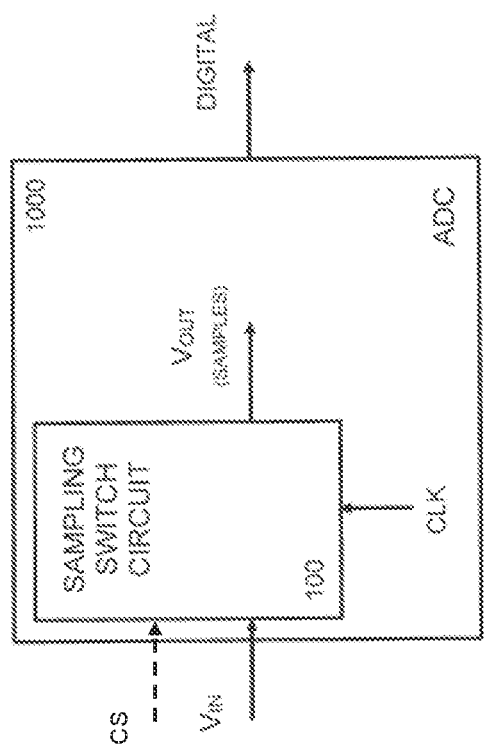
FIG. 11 is a schematic diagram of an ADC embodying the present invention.

FIG. 11 is a schematic diagram of an ADC 1000 embodying the present invention. The ADC 1000 comprises any of the sampling switch circuits disclosed herein, indicated as 100 in FIG. 11 for simplicity but of course sampling switch circuit 200 is equally applicable. The ADC 1000 may in turn output a digital signal, as shown, based on the voltage mode samples $V_{OUT}$.

Figure 12:
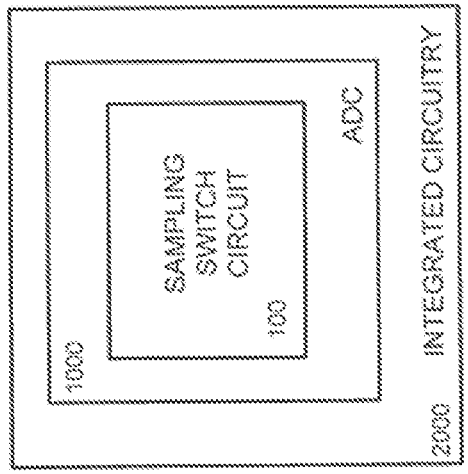
FIG. 12 is a schematic diagram of integrated circuitry embodying the present invention.

Any of the circuitry disclosed herein may be implemented as integrated circuitry or as an integrated circuit, for example as (or as part of) and IC chip, such as a flip chip. FIG. 12 is a schematic diagram of integrated circuitry 2000 embodying the present invention. The integrated circuitry 2000 may comprise the ADC 1000 of FIG. 11 and/or any of the sampling switch circuits previously disclosed herein (such as circuits 100 and 200), indicated as 100 in FIG. 12 for simplicity.

Integrated circuitry 2000 may be representative of some or all of an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. A sampling switch circuit, comprising:
   an input node, connected to receive an input voltage signal to be sampled;
   a sampling transistor comprising a gate terminal, a source terminal and a drain terminal, the source terminal connected to the input node;
   a capacitor;
   a current source configured to cause a defined current to flow therethrough; and
   switching circuitry configured to alternate between a precharge configuration and an output configuration in dependence upon a clock signal,
   wherein:
   in the precharge configuration, the switching circuitry connects the capacitor into a current path between said current source and a first voltage reference node to form a potential difference across the capacitor which is dependent on the defined current; and
   in the output configuration, the switching circuitry connects the capacitor between a second voltage reference node and the gate terminal of the sampling transistor so that a voltage level applied at the gate terminal of the sampling transistor is dependent on the defined current.

2. The sampling switch circuit as claimed in claim 1, wherein the current source is a controllable current source and configured such that the defined current is dependent on a control signal.

3. The sampling switch circuit as claimed in claim 2, wherein:
   the control signal comprises a control voltage signal, and the controllable current source is configured such that the defined current is dependent on a voltage level of the control voltage signal;
   and/or
   the control signal comprises a control digital signal, and the controllable current source is configured such that the defined current is dependent on a digital value of the control digital signal.

4. The sampling switch circuit as claimed in claim 3, wherein the control signal or the control voltage signal is, or is dependent upon, the input voltage signal.

5. The sampling switch circuit as claimed in claim 2, wherein:
   the controllable current source comprises at least one transistor connected to control the defined current based on its gate voltage; and
   the at least one transistor of the controllable current source is connected such that its gate voltage is dependent on the control signal.

6. The sampling switch circuit as claimed in claim 1, wherein:
   the capacitor comprises first and second terminals;
   the switching circuitry comprises first and second pairs of switches;
   the first pair of switches comprises a first switch connected between the first terminal of the capacitor and the current source, and a second switch connected between the second terminal of the capacitor and the first voltage reference node; and
   the second pair of switches comprises a third switch connected between the first terminal of the capacitor and the second voltage reference node and a fourth switch connected between the second terminal of the capacitor and the gate terminal of the sampling transistor.

7. The sampling switch circuit as claimed in claim 6, wherein:
   the switching circuitry is configured such that, in the precharge configuration, the first and second switches are ON and the third and fourth switches are OFF, and, in the output configuration, the first and second switches are OFF and the third and fourth switches are ON.

8. The sampling switch circuit as claimed in claim 6, wherein the first, second, third and fourth switches are implemented as transistors, optionally as field-effect transistors.

9. The sampling switch circuit as claimed in claim 8, wherein the current source comprises at least one transistor, and wherein the third and fourth switches are larger than the at least one transistor and optionally larger than the first and second switches.

10. The sampling switch circuit as claimed in claim 6, wherein:

the fourth switch is a transistor comprising a gate terminal, a source terminal and a drain terminal;

the capacitor is a first capacitor;

the sampling switch circuit comprises a second capacitor; and in the precharge configuration, the switching circuitry connects the second capacitor to form a given potential difference across the second capacitor; and in the output configuration, the switching circuitry connects the second capacitor between the gate and source terminals of the fourth switch so that a gate-source voltage of the fourth switch is defined by said given potential difference.

11. The sampling switch circuit as claimed in claim 1, wherein the switching circuitry is configured, in the precharge configuration, to connect the gate terminal of the sampling transistor to a third voltage reference node so that a voltage level applied at the gate terminal of the sampling transistor in the precharge configuration is dependent on a voltage level provided at the third voltage reference node.

12. The sampling switch circuit as claimed in claim 11, wherein:

the switching circuitry comprises a holding switch connected between the gate terminal of the sampling transistor and the third reference voltage reference node; and the switching circuitry is configured such that in the precharge configuration the holding switch is ON and in the output configuration the holding switch is OFF, optionally wherein the holding switch is implemented as a transistor.

13. Multi-channel sampling circuitry, comprising a plurality of sampling switch circuits as claimed in claim 1, wherein:

each said sampling switch circuit is configured to operate based on its own clock signal; and the input nodes for said sampling switch circuits are connected together to form a common input node and receive the same input voltage signal as one another.

14. Integrated circuitry, such an IC chip, comprising the multi-channel sampling circuitry as claimed in claim 13.

15. An analogue-to-digital converter, comprising the sampling switch circuit as claimed in claim 1, or the multi-channel sampling circuitry as claimed in claim 13.

16. Integrated circuitry, such an IC chip, comprising the analogue-to-digital converter as claimed in claim 15.

17. Integrated circuitry, such an IC chip, comprising the sampling switch circuit as claimed in claim 1.

* * * * *